(12) United States Patent
Takahashi et al.

(10) Patent No.: US 11,417,496 B2
(45) Date of Patent: Aug. 16, 2022

(54) STAGE DEVICE, CHARGED PARTICLE BEAM APPARATUS, AND VACUUM APPARATUS

(71) Applicant: Hitachi, Ltd., Tokyo (JP)

(72) Inventors: Motohiro Takahashi, Tokyo (JP); Takanori Kato, Tokyo (JP); Naruo Watanabe, Tokyo (JP); Hironori Ogawa, Tokyo (JP)

(73) Assignee: Hitachi, Ltd., Tokyo (JP)

( * ) Notice: Subject to any disclaimer, the term of this patent is extended or adjusted under 35 U.S.C. 154(b) by 87 days.

(21) Appl. No.: 17/043,950

(22) PCT Filed: Mar. 1, 2019

(86) PCT No.: PCT/JP2019/008226
§ 371 (c)(1),
(2) Date: Sep. 30, 2020

(87) PCT Pub. No.: WO2019/225110
PCT Pub. Date: Nov. 28, 2019

(65) Prior Publication Data
US 2021/0027978 A1    Jan. 28, 2021

(30) Foreign Application Priority Data

May 23, 2018    (JP) .............................. JP2018-098995

(51) Int. Cl.
*H01J 37/20*    (2006.01)
(52) U.S. Cl.
CPC ......... *H01J 37/20* (2013.01); *H01J 2237/188* (2013.01); *H01J 2237/202* (2013.01)

(58) Field of Classification Search
CPC ............... H01J 377/20; H01J 2237/202; H01J 2237/20221; H01J 2237/20228
See application file for complete search history.

(56) References Cited

U.S. PATENT DOCUMENTS

| | | |
|---|---|---|
| 2002/0137358 A1 | 9/2002 | Binnard et al. |
| 2002/0145721 A1 | 10/2002 | Korenaga et al. |
| 2005/0168086 A1 | 8/2005 | Tamaki |

FOREIGN PATENT DOCUMENTS

| | | |
|---|---|---|
| JP | 2000-106344 A | 4/2000 |
| JP | 2005-209670 A | 8/2005 |

OTHER PUBLICATIONS

International Search Report (PCT/ISA/210) issued in PCT Application No. PCT/JP2019/008226 dated Apr. 9, 2019 with English translation (two (2) pages).

(Continued)

*Primary Examiner* — Eliza W Osenbaugh-Stewart
(74) *Attorney, Agent, or Firm* — Crowell & Moring LLP

(57) ABSTRACT

The problem addressed by the present disclosure is to provide a stage device, a charged particle beam device, and a vacuum device, with which it is possible to increase the speed and the acceleration of positioning and to suppress the leakage of a magnetic field. As a means to resolve this problem, a stage device 100 comprises a support stage 10, a floating mechanism 20, and a movement stage 30. The movement stage 30 has a propulsion-applying unit 36, and the support stage 10 has a propulsion-receiving unit 11. The stage device 100 is configured so that when the movement stage 30 moves and the propulsion-applying unit 36 contacts or approaches the propulsion-receiving unit 11, the propulsion-applying unit 36 applies propulsion in the movement direction to the propulsion-receiving unit 11.

12 Claims, 13 Drawing Sheets

(56) References Cited

OTHER PUBLICATIONS

Japanese-language Written Opinion (PCT/ISA/237) issued in PCT Application No. PCT/JP2019/008226 dated Apr. 9, 2019 (five (5) pages).

STAGE DEVICE, CHARGED PARTICLE BEAM APPARATUS, AND VACUUM APPARATUS

TECHNICAL FIELD

The present disclosure relates to a stage device, a charged particle beam apparatus, and a vacuum apparatus.

BACKGROUND ART

Conventionally, there is known an invention relating to a multi-point support assembly for precisely positioning and supporting a device stage and a wafer for an exposure apparatus (see PTL 1 below). PTL 1 describes a device stage assembly that moves a device with respect to a mounting base.

This conventional device stage assembly includes the device stage, a mover housing, a support assembly, and a control system (see the same document, claim 1 and the like). The device stage holds the device. The support assembly includes at least four spaced apart Z device stage movers which are connected to the device stage and move the device stage relative to the mover housing. The control system controls the Z device stage movers so as to suppress deformation of the device stage during movement of the device stage by the Z device stage mover.

The Z device stage mover includes a magnet and a conductor, and a current passing through the conductor causes the conductor to interact with a magnetic field of the magnet to generate a force (Lorentz-type force) between the magnet and the conductor. This Z device stage mover selectively moves and supports the device stage along the Z axis, around the X axis, and around the Y axis (see paragraphs 0058 to 0061, etc. in the same document).

In addition, the device stage assembly includes a stage mover assembly (see paragraph 0028, etc. in the same document). The stage mover assembly includes a mover housing, a guide assembly, a fluid bearing, a magnetic-type bearing, or a roller bearing, and the like, and moves the mover housing in the X-axis direction and the Y-axis direction (see paragraphs 0035 to 0040, etc. in the same document). A control system controls the stage mover assembly and the support assembly to precisely position the device stage and device (see paragraph 0078, etc. in the same document).

CITATION LIST

Patent Literature

PTL 1: US 2002/0137358 A

SUMMARY OF INVENTION

Technical Problem

For example, in steps such as manufacturing, measuring, and inspecting of a semiconductor wafer, a stage device such as the conventional device stage assembly is used to precisely position the semiconductor wafer. In such a stage device, increases in speed and acceleration of positioning are required, for example, in order to shorten the positioning time of the semiconductor wafer, In the conventional device stage assembly described above, however, a Z device stage mover becomes large and the leakage of a magnetic field increases if the speeded and the acceleration of positioning of the device stage are increased in order to shorten the positioning time of the semiconductor wafer, for example. The leakage of the magnetic field in the stage device causes distortion of an electron beam in a charged particle beam apparatus, such as an electron microscope, and reduces the irradiation accuracy of the electron beam.

The present disclosure provides a stage device, a charged particle beam apparatus, and a vacuum apparatus, with which it is possible to increase the speed and the acceleration of positioning and to suppress the leakage of a magnetic field.

Solution to Problem

One aspect of the present disclosure is a stage device including: a support stage that supports an object to be positioned; a floating mechanism that magnetically levitates and positions the support stage; and a movement stage that supports the floating mechanism on a flat surface and moves the floating mechanism in a movement direction along the flat surface. The movement stage has a propulsion-applying unit that protrudes toward the support stage. The support stage has a propulsion-receiving unit that opposes the propulsion-applying unit with a gap in the movement direction. When the movement stage moves in the movement direction and the propulsion-applying unit contacts or approaches the propulsion-receiving unit, the propulsion-applying unit applies propulsion in the movement direction to the propulsion-receiving unit.

Advantageous Effects of Invention

According to the one aspect of the present disclosure, it is possible to provide the stage device, the charged particle beam apparatus, and the vacuum apparatus with which it is possible to increase the speed and the acceleration of positioning and to suppress the leakage of the magnetic field.

DESCRIPTION OF EMBODIMENTS

Hereinafter, embodiments of a stage device, a charged particle beam apparatus, and a vacuum apparatus according to the present disclosure will be described with reference to the drawings.

Figure 1:
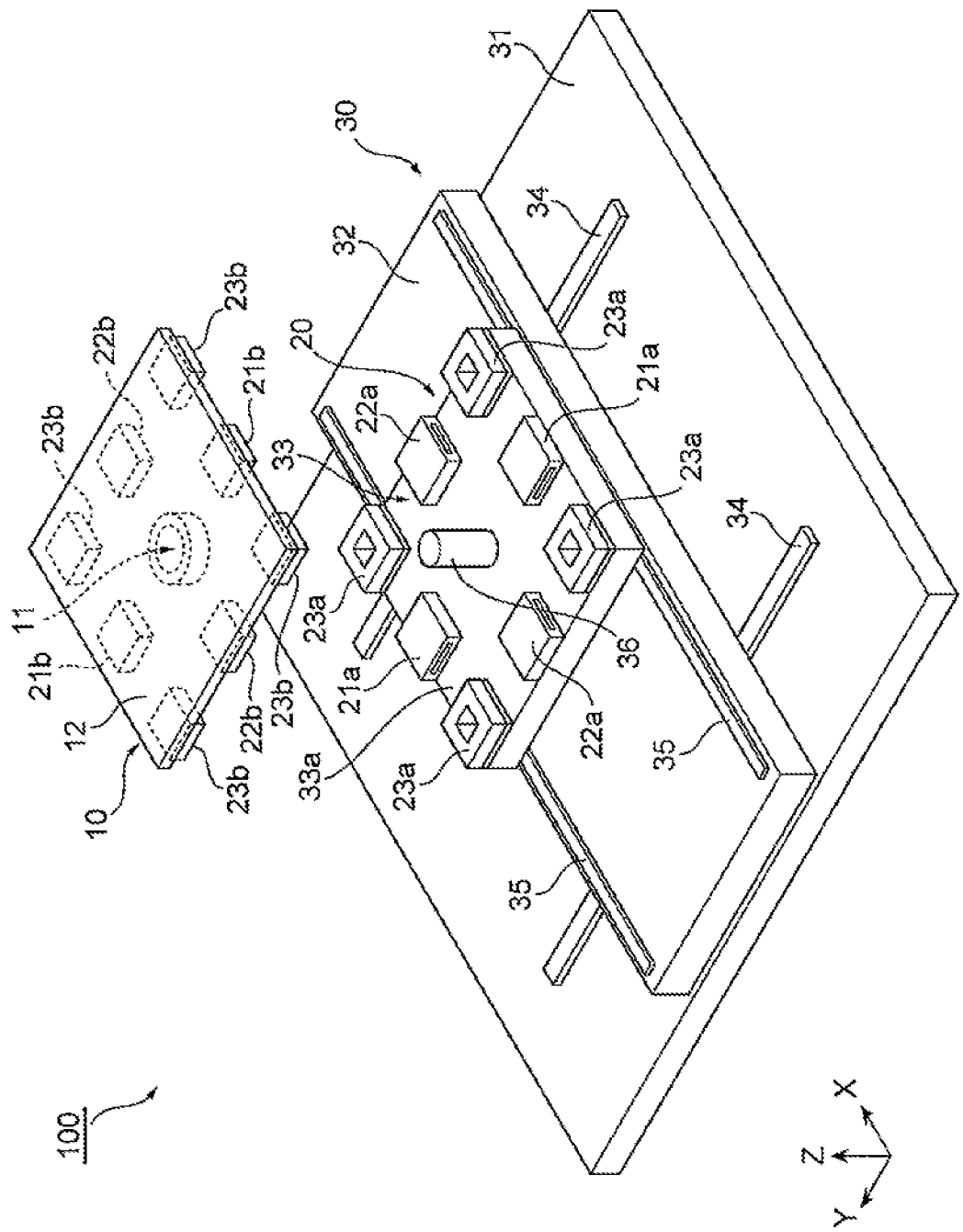
FIG. 1 is an exploded perspective view of essential parts of a stage device according to an embodiment of the present disclosure.
Figure 2:
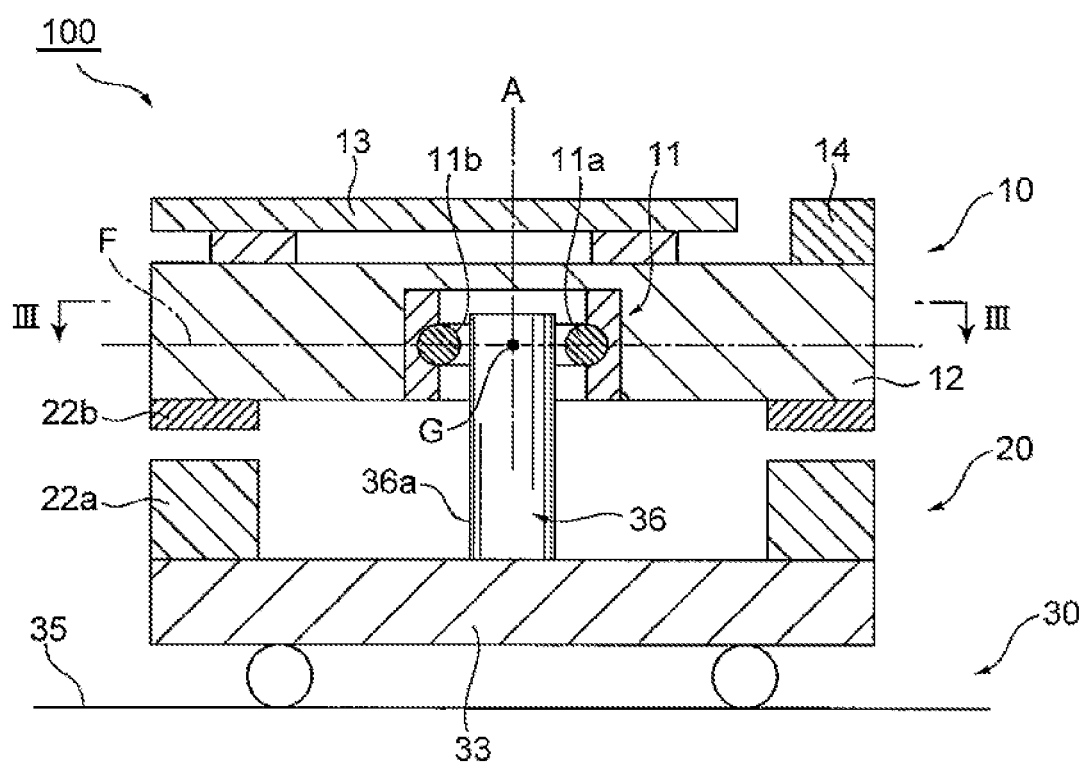
FIG. 2 is a schematic cross-sectional view of the stage device illustrated in FIG. 1.

FIG. 1 is an exploded perspective view of essential parts of a stage device 100 according to an embodiment of the present disclosure. FIG. 2 is a schematic cross-sectional view of the stage device 100 illustrated in FIG. 1. The stage device 100 of the present embodiment is a device configured to perform positioning of an object, such as a wafer, with high accuracy and high speed in, for example, a semiconductor manufacturing device or an inspection device.

Although details will be described later, the stage device 100 of the present embodiment is mainly characterized by the following configurations. The stage device 100 includes: a support stage 10 that supports an object to be positioned; a floating mechanism 20 that magnetically levitates and positions the support stage 10; and a movement stage 30 that supports the floating mechanism 20 on a flat surface and moving the floating mechanism 20 in a movement direction along the flat surface. The movement stage 30 has a propulsion-applying unit 36 that protrudes toward the support stage 10. The support stage 10 has a propulsion-receiving unit 11 that opposes the propulsion-applying unit 36 with a gap in the movement direction of the movement stage 30. The stage device 100 is configured so that the propulsion-applying unit 36 applies propulsion in the movement direction to the propulsion-receiving unit 11 when the movement stage 30 moves in the movement direction and the propulsion-applying unit 36 contacts or approaches the propulsion-receiving unit 11.

Hereinafter, each configuration of the stage device 100 of the present embodiment will be described in detail. Hereinafter, each part will be sometimes described using an XYZ orthogonal coordinate system in which a plane parallel to the movement direction of the support stage 10 is an XY plane.

The movement stage 30 has, for example, a base 31, a Y-table 32, and an X-table 33. The base 31 is, for example, a rectangular flat plate-shaped metal member, and has a pair of Y-guides 34 extending in the Y-axis direction on an upper surface parallel to the XY plane.

The Y-table 32 is, for example, a rectangular plate-shaped metal member, and is arranged to oppose the upper surface of the base 31 such that long sides of the rectangle are parallel to the X-axis direction and short sides of the rectangle are parallel to the Y-axis direction. The Y-table 32 is engaged with a Y-guide 34 via a rolling element, such as a ball, and is provided so as to be movable in the Y-axis direction along the Y-guide 34 by a Y-axis motor (not illustrated). The Y-table 32 has a pair of X-guides 35 extending in the X-axis direction on the upper surface opposite to the base 31.

The X-table 33 is, for example, a rectangular plate-shaped metal member, is engaged with the X-guide 35 via a rolling element, such as a ball, and is provided so as to be movable in the X-axis direction along the X-guide 35 by an X-axis motor (not illustrated). An upper surface of the X-table opposite to the Y-table 32 is a support surface 33a parallel to the XY plane, and the floating mechanism 20 is supported on the support surface 33a. Further, the X-table 33 has the propulsion-applying unit 36 at the center of the support surface 33a.

In the example illustrated in FIGS. 1 and 2, the propulsion-applying unit 36 is provided in a columnar shape protruding from the movement stage 30 toward the support stage 10. An outer peripheral surface of the propulsion-applying unit 36 is a cylindrical propulsion-applying surface 36a that is orthogonal to the movement direction of the movement stage 30 along the XY plane and is centered on an axis A along the Z-axis direction which is a protruding direction of the propulsion-applying unit 36. That is, the propulsion-applying surface 36a is the outer peripheral surface of the columnar or cylindrical propulsion-applying unit 36 in the examples illustrated in FIGS. 1 and 2.

The movement stage 30 is configured to be capable of individually controlling the X-axis motor that moves the X-table 33 along the X-axis direction and the Y-axis motor that moves the Y-table 32 along the Y-axis direction. As a result, the movement stage 30 can move the floating mechanism 20 supported on the XY plane and the support stage 10 supported by the floating mechanism 20 at high speed and high acceleration in any movement direction along the XY plane. In the stage device 100, the movement stage 30 forms, for example, a rough movement mechanism that moves the support stage 10 with a stroke larger than that of the floating mechanism 20.

The floating mechanism 20 has, for example, an X-coil 21a and an X-magnet 21b, a Y-coil 22a and a Y-magnet 22b, and a Z-coil 23a and a Z-magnet 23b. More specifically, the floating mechanism 20 has, for example, two sets of the X-coil 21a and X-magnet 21b, two sets of the Y-coil 22a and Y-magnet 22b, and four sets of the Z-coil 23a and Z-magnet 23b. The X-magnet 21b, the Y-magnet 22b, and the Z-magnet 23b are, for example, permanent magnets.

The X-coils 21a are fixed to centers in the X-axis direction at both ends in the Y-axis direction on the support surface 33a of the X-table 33, for example. The X-magnets 21b are fixed to the centers in the X-axis direction at both ends in the Y-axis direction on a lower surface of the support stage 10 opposing the support surface 33a of the X-table 33, for example, and oppose the X-coils 21a in the Z-axis direction.

The Y-coils 22a are fixed to centers in the Y-axis direction at both ends in the X-axis direction on the support surface 33a of the X-table 33, for example. The Y-magnets 22b are fixed to the centers in the Y-axis direction at both ends in the X-axis direction on a lower surface of the support stage 10 opposing the support surface 33a of the X-table 33, for example, and oppose the Y-coils 22a in the Z-axis direction.

The Z-coils 23a are fixed to four corners of the support surface 33a of the rectangular X-table 33, for example. The Z-magnets 23b are fixed to four corners of a lower surface of the support stage 10 opposing the support surface 33a of the rectangular X-table 33, and oppose the Z-coils 23a in the Z-axis direction, for example.

The floating mechanism 20 is configured so as to be capable of individually controlling currents flowing through the respective X-coils 21a, the respective Y-coils 22a, and the respective Z-coils 23a. As a result, the floating mechanism 20 magnetically levitates the support stage 10, and can position the support stage 10, for example, by controlling a position P1 (x, y, z) and a posture P2 (θx, θy, θz) of the support stage 10 with six degrees of freedom.

The support stage 10 has, for example, a propulsion-receiving unit 11, a top table 12, a sample table 13, and a bar mirror 14. Note that the sample table 13 and the bar mirror 14 are not illustrated in FIG. 1. The top table 12 is, for example, a rectangular plate-shaped metal member, and has a peripheral edge portion of a lower surface opposing the X-table 33 to which the X-magnets 21*b*, the Y-magnets 22*b*, and the Z-magnets 23*b* are fixed, and a central portion provided with propulsion-receiving unit 11.

Figure 3:
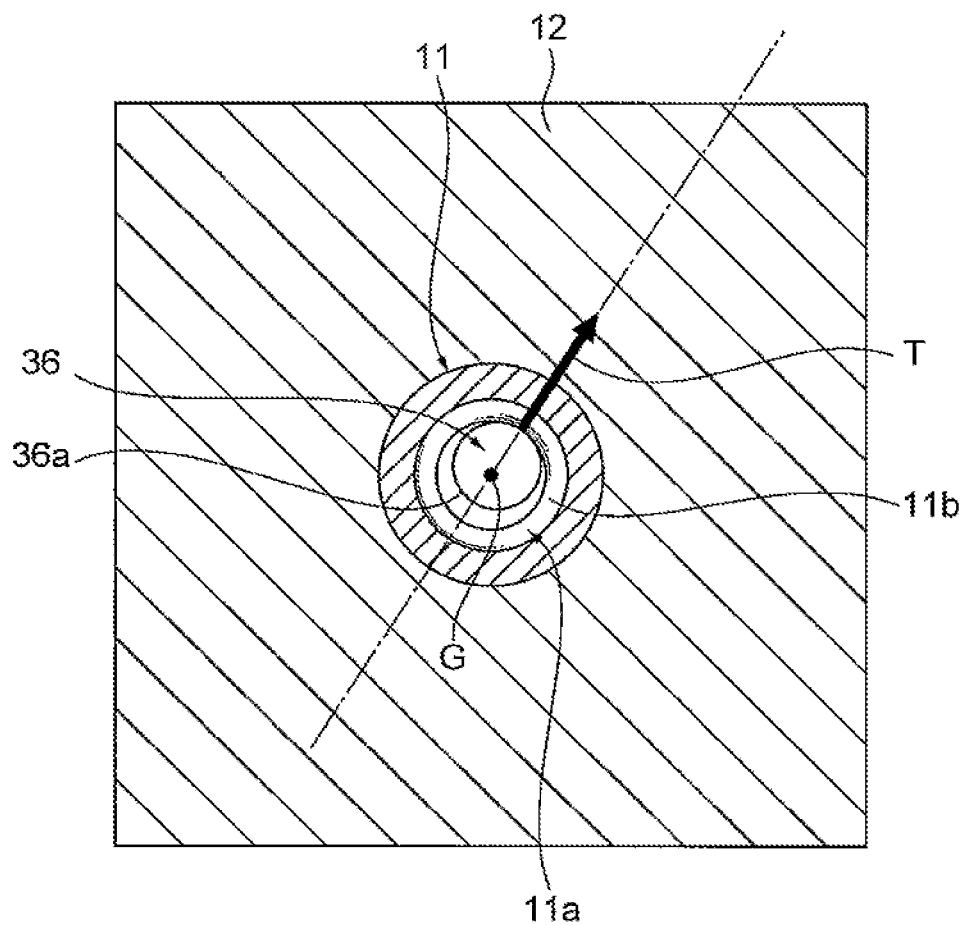
FIG. 3 is a cross-sectional view taken along line III-III of the stage device illustrated in FIG. 2.

FIG. 3 is a cross-sectional view taken along line III-III of the stage device 100 illustrated in FIG. 2. The propulsion-receiving unit 11 is provided, for example, in a cylindrical shape centered on the axis A passing through the center of gravity G of the support stage 10, and has a contact portion 11*a* on an inner peripheral surface. The contact portion 11*a* has, for example, a circular cross section. The contact portion 11*a* is provided in an annular shape surrounding the propulsion-applying unit 36, and is embedded in the inner peripheral surface of the propulsion-receiving unit 11 on the outer peripheral side and protrudes from the inner peripheral surface of the propulsion-receiving unit 11 toward the propulsion-applying unit 36 on the inner peripheral side. The contact portion 11*a* is fixed to the propulsion-receiving unit 11 such that an apex of a semi-cylindrical portion protruding toward the propulsion-applying unit 36 is located on a plane F passing through the center of gravity G of the support stage 10. The plane F passing through the center of gravity G of the support stage 10 is parallel to an upper surface and a lower surface of the top table 12.

In the example illustrated in FIGS. 2 and 3, the propulsion-receiving unit 11 has a propulsion-receiving surface 11*b* having at least a portion opposing the propulsion-applying surface 36*a* of the propulsion-applying unit 36 whose contour shape of a cross section taken along the axis A is an arc shape protruding toward the propulsion-applying surface 36*a*. The propulsion-receiving surface 11*b* is, for example, an inner peripheral surface of the annular propulsion-receiving unit 11 that surrounds the propulsion-applying unit 36. More specifically, the propulsion-receiving surface 11*b* is, for example, the inner peripheral surface of the contact portion 11*a* of the propulsion-receiving unit 11 provided in the annular shape having a circular cross section and surrounding the propulsion-applying unit 36.

The sample table 13 is fixed to the upper surface of the top table 12 on the side opposite to the movement stage 30, and holds and fixes an object to be positioned, such as a semiconductor wafer, on the support stage 10. A surface of the sample table 13 holding the object is parallel to the upper surface of the top table 12, for example. The bar mirror 14, for example, is configured to measure the position and posture of the support stage 10 by a laser interferometer, and is provided so as to extend along one side edge parallel to the X axis and one side edge parallel to the Y axis on the upper surface of the top table 12.

Figure 4:
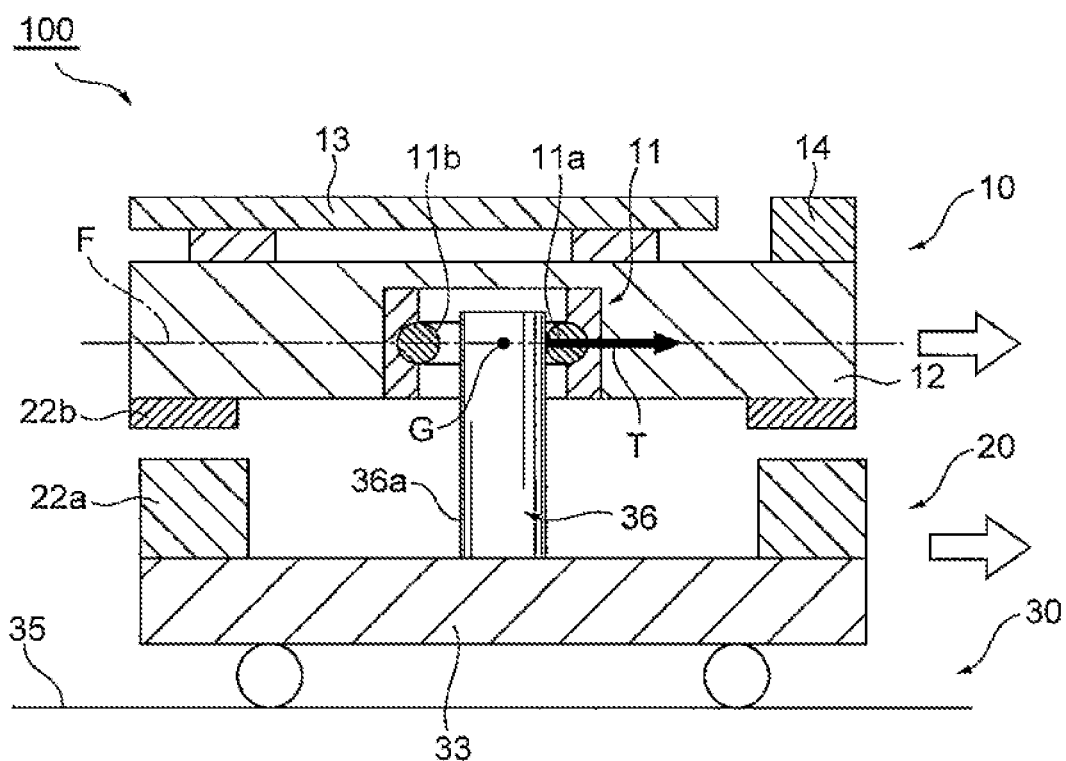
FIG. 4 is a schematic cross-sectional view illustrating an operation of the stage device illustrated in FIG. 2.

Hereinafter, an operation of the stage device 100 of the present embodiment will be described based on comparison with a conventional stage device with reference to FIGS. 3 and 4. FIG. 4 is a schematic cross-sectional view illustrating the operation of the stage device 100 illustrated in FIG. 2.

Figure 13:
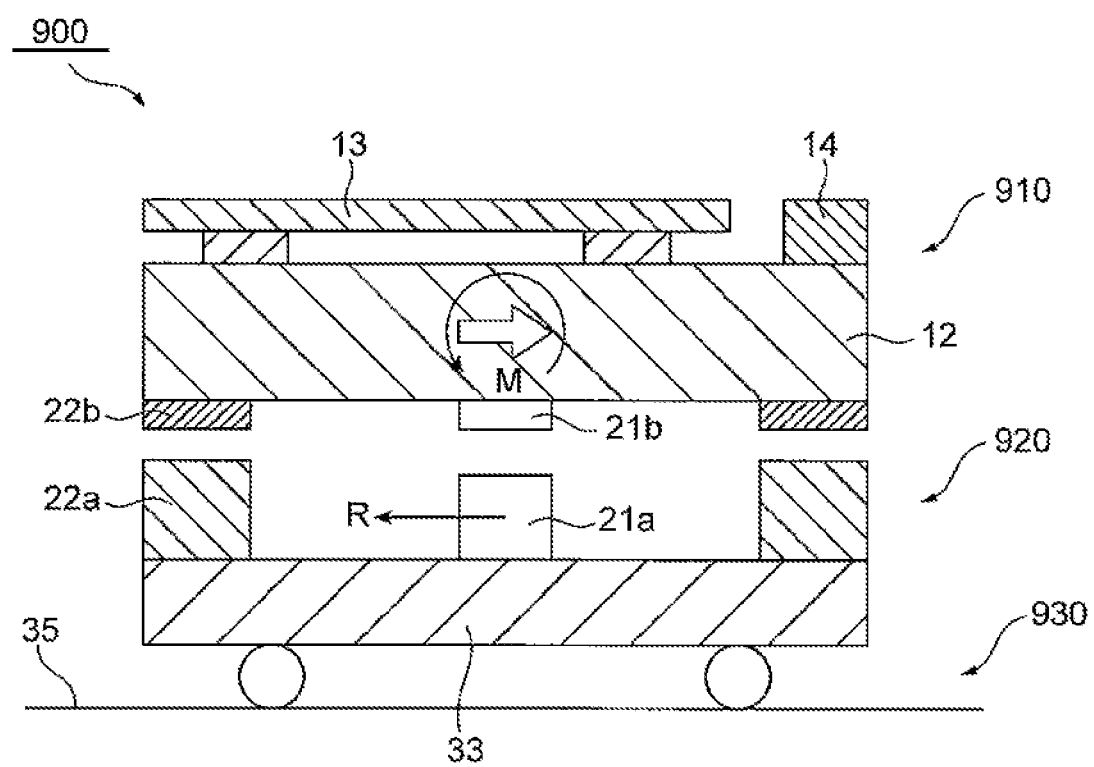
FIG. 13 is a schematic cross-sectional view illustrating an example of a conventional stage device.

FIG. 13 is a schematic cross-sectional view illustrating an example of a conventional stage device 900. This conventional stage device 900 is different from the stage device 100 of the present embodiment in terms that a support stage 910 does not have the propulsion-receiving unit 11 and a movement stage 930 does not have the propulsion-applying unit 36. Note that the same components as those of the stage device 100 of the present embodiment are designated by the same reference signs, and the description thereof will be omitted in FIG. 13.

In the conventional stage device 900, a reaction force R in the horizontal direction acts on the X-coil 21*a* of a floating mechanism 920 when the support stage 910 is moved at high acceleration in the X-axis direction. Further, a moment M about the Y axis acts on the support stage 910, and a large load is also applied to the Z-coil 23*a*. That is, the load on each axis motor, that is, the X-coil 21*a*, the Y-coil 22*a*, and the Z-coil 23*a* increases by increasing the speed in the conventional stage device 900 which is a rough/fine movement-type magnetic floating stage. Therefore, it is necessary to increase a size of an electromagnetic actuator including the X-coil 21*a*, the Y-coil 22*a*, and the Z-coil 23*a*. The increase in size of the electromagnetic actuator causes an increase in leakage of a magnetic field, an increase in heat generation, a decrease in responsiveness due to an increase in movable mass, and an increase in device size and manufacturing cost.

On the other hand, the stage device 100 of the present embodiment includes: the support stage 10 that supports an object to be positioned; the floating mechanism 20 that magnetically levitates and positions the support stage 10; and the movement stage 30 that supports the floating mechanism 20 on the XY plane and moving the floating mechanism 20 in the movement direction along the XY plane, as described above. The movement stage 30 has the propulsion-applying unit 36 that protrudes toward the support stage 10, and the support stage has the propulsion-receiving unit 11 that opposes the propulsion-applying unit 36 with a gap in the movement direction of the movement stage 30. Further, the stage device 100 is configured so that the propulsion-applying unit 36 applies propulsion in the movement direction to the propulsion-receiving unit 11 when the movement stage 30 moves in the movement direction and the propulsion-applying unit 36 contacts or approaches the propulsion-receiving unit 11.

More specifically, when the movement stage 30 moves in the movement direction along the XY plane, the propulsion-applying unit 36 contacts the propulsion-receiving unit 11, and the propulsion-applying unit 36 applies propulsion T in the movement direction of the movement stage 30 to the propulsion-receiving unit 11 as illustrated in FIG. 3. Further, when the movement stage 30 moves in the positive X-axis direction, the propulsion-applying unit 36 contacts the propulsion-receiving unit 11, and the propulsion-applying unit 36 applies propulsion T in the positive X-axis direction to the propulsion-receiving unit 11 as illustrated in FIG. 4. That is, the stage device 100 of the present embodiment is configured so that the propulsion-applying unit 36 applies the propulsion T to the propulsion-receiving unit 11 when the propulsion-applying unit 36 contacts the propulsion-receiving unit 11.

As a result, the stage device 100 of the present embodiment can obtain the propulsion for accelerating and decelerating the support stage 10 from the movement stage 30 when moving the support stage 10 at high speed and high acceleration. Therefore, an increase in each load on the X-coil 21*a*, the Y-coil 22*a*, and the Z-coil 23*a* is suppressed, and the X-coil 21*a*, the Y-coil 22*a*, and the Z-coil 23*a* can be downsized. The reduction in size of the electromagnetic actuator including the X-coil 21*a*, the Y-coil 22*a*, and the Z-coil 23*a* can suppress the leakage of the magnetic field, suppress the heat generation, improve the responsiveness by reducing the movable mass, and reduce the device size and manufacturing cost.

Further, the support stage 10 is levitated and positioned by the floating mechanism 20 using magnetism in the stage device 100 of the present embodiment. Since the floating mechanism 20 magnetically levitates and positions the support stage 10 in this manner, it is possible to eliminate non-linear characteristics such as stick-slip caused by friction between a guide and a rolling element, which is different from the case of positioning the support stage 10 using the guide and the rolling element. Therefore, the floating mechanism 20 can improve the positioning accuracy of the support stage 10 as compared with the case of positioning the support stage 10 using the guide and the rolling element.

Further, since the floating mechanism 20 magnetically levitates and positions the support stage 10, the support stage 10 does not receive an external force caused by thermal deformation from other members or an external force caused by friction between the guide and the rolling element, which is different from the case of using the guide and the rolling element. Therefore, the floating mechanism 20 can improve the positioning accuracy of the support stage 10 as compared with the case of positioning the support stage 10 using the guide and the rolling element. As a result, it is possible to meet a demand for higher positioning accuracy than ever due to the recent miniaturization of semiconductor elements.

Furthermore, the floating mechanism 20 magnetically levitates and positions the support stage 10, and thus, can be easily applied to a vacuum environment, which is different from an aerostatic guide. In the stage device 100 of the present embodiment, the floating mechanism 20 forms, for example, a fine movement mechanism for precisely positioning the support stage 10. That is, the stage device 100 of the present embodiment forms the coarse and fine movement mechanism using the floating mechanism 20, which can perform precise positioning but has a small stroke, and the movement stage 30 which has a large stroke and can move at high speed and high acceleration, but is likely to cause a positioning error. Note that, when the support stage 10 does not move at high speed or high acceleration but moves at low speed, the propulsion-applying unit 36 of the movement stage 30 and the propulsion-receiving unit 11 of the support stage 10 are maintained in a non-contact state of opposing each other with a gap, and no propulsion is applied from the propulsion-applying unit 36 to the propulsion-receiving unit 11.

Further, the propulsion-applying unit 36 has the cylindrical propulsion-applying surface 36a centered on the axis A that is orthogonal to the movement direction and extends along the protruding direction of the propulsion-applying unit 36 in the stage device 100 of the present embodiment. The propulsion-receiving unit 11 has at the propulsion-receiving surface 11b having at least a portion opposing the propulsion-applying surface 36a whose contour shape of the cross section taken along the axis A is the arc shape protruding toward the propulsion-applying surface 36a. As a result, the stage device 100 is configured so that the propulsion-applying surface 36a contacts the propulsion-receiving surface 11b when the propulsion-applying unit 36 contacts the propulsion-receiving unit 11. With this configuration, the stage device 100 can bring the propulsion-applying unit 36 into contact with the propulsion-receiving unit 11 in a state close to point contact or line contact, and efficiently apply the propulsion T in the movement direction of the movement stage 30 to the support stage 10.

Further, in the stage device 100 of the present embodiment, the propulsion-applying surface 36a is the outer peripheral surface of the columnar or cylindrical propulsion-applying unit 36, and the propulsion-receiving surface 11b is the inner peripheral surface of the annular propulsion-receiving unit 11 that surrounds the propulsion-applying unit 36. As a result, when the movement stage 30 moves at high speed and high acceleration in any direction along the XY plane, the propulsion-applying surface 36a, which is the outer peripheral surface of the columnar or cylindrical propulsion-applying unit 36, can be reliably brought into contact with the propulsion-receiving surface 11b which is the inner peripheral surface of the annular propulsion-receiving unit 11 that surrounds the propulsion-applying unit 36.

Further, the propulsion-receiving unit 11 has the contact portion 11a that contacts the propulsion-applying unit in the stage device 100 of the present embodiment. The contact portion 11a is provided in the annular shape surrounding the propulsion-applying unit 36, and the apex of the semi-cylindrical portion protruding toward the propulsion-applying unit 36 is located on the plane F passing through the center of gravity G of the support stage 10. With this configuration, a straight line passing through the center of gravity G of the support stage 10 and the apex of the contact portion 11a that receives the propulsion T in the movement direction can be aligned with the direction of the propulsion T as illustrated in FIGS. 3 and 4. As a result, it is possible to suppress generation of moments about the Y axis and the X axis on the support stage 10, reduce the load on the Z-coil 23a, and reduce the size of the Z-coil 23a. Therefore, it is possible to suppress the leakage of the magnetic field, suppress the heat generation, improve the responsiveness by reducing the movable mass, and reduce the device size and manufacturing cost.

As described above, it is possible to provide the stage device 100 capable of increasing the speed and acceleration of the positioning and suppressing the leakage of the magnetic field according to the present embodiment. Note that the stage device according to the present disclosure is not limited to the configuration of the stage device 100 according to the above-described embodiment.

For example, the above-described embodiment has been described regarding the stage device 100 configured so that the propulsion-applying unit 36 applies the propulsion T in the movement direction to the propulsion-receiving unit 11 when the movement stage 30 moves in the movement direction and the propulsion-applying unit 36 contacts the propulsion-receiving unit 11. However, the stage device 100 may be configured so that the propulsion-applying unit 36 applies the propulsion T in the movement direction to the propulsion-receiving unit 11 when the movement stage 30 moves in the movement direction and the propulsion-applying unit 36 approaches the propulsion-receiving unit 11.

More specifically, the propulsion-applying unit 36 and the propulsion-receiving unit 11 may include permanent magnets that repel each other in the stage device 100. As a result, the propulsion-applying unit 36 can apply the propulsion T to the propulsion-receiving unit 11 by a repulsive force between the permanent magnets when the propulsion-applying unit 36 approaches the propulsion-receiving unit 11. Hereinafter, some modifications of the stage device 100 according to the above-described embodiment will be described.

Figure 5:
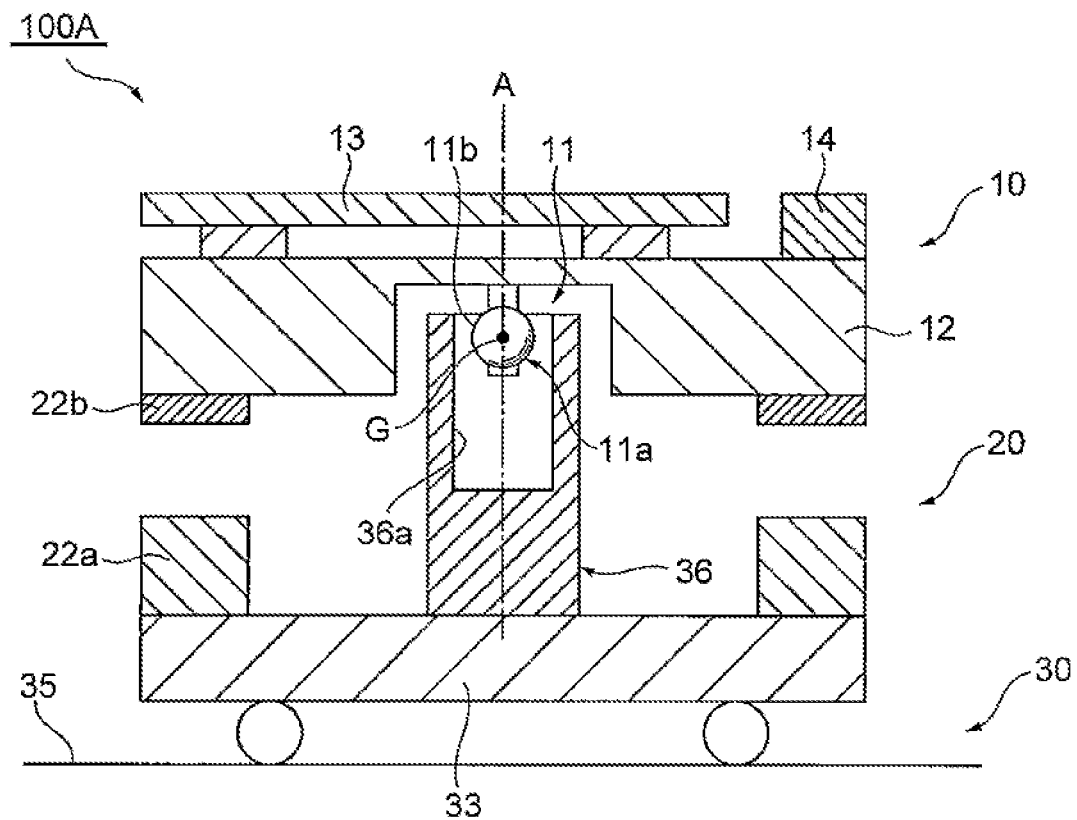
FIG. 5 is a schematic cross-sectional view of a stage device according to a modification of the stage device illustrated in FIG. 2.
Figure 6:
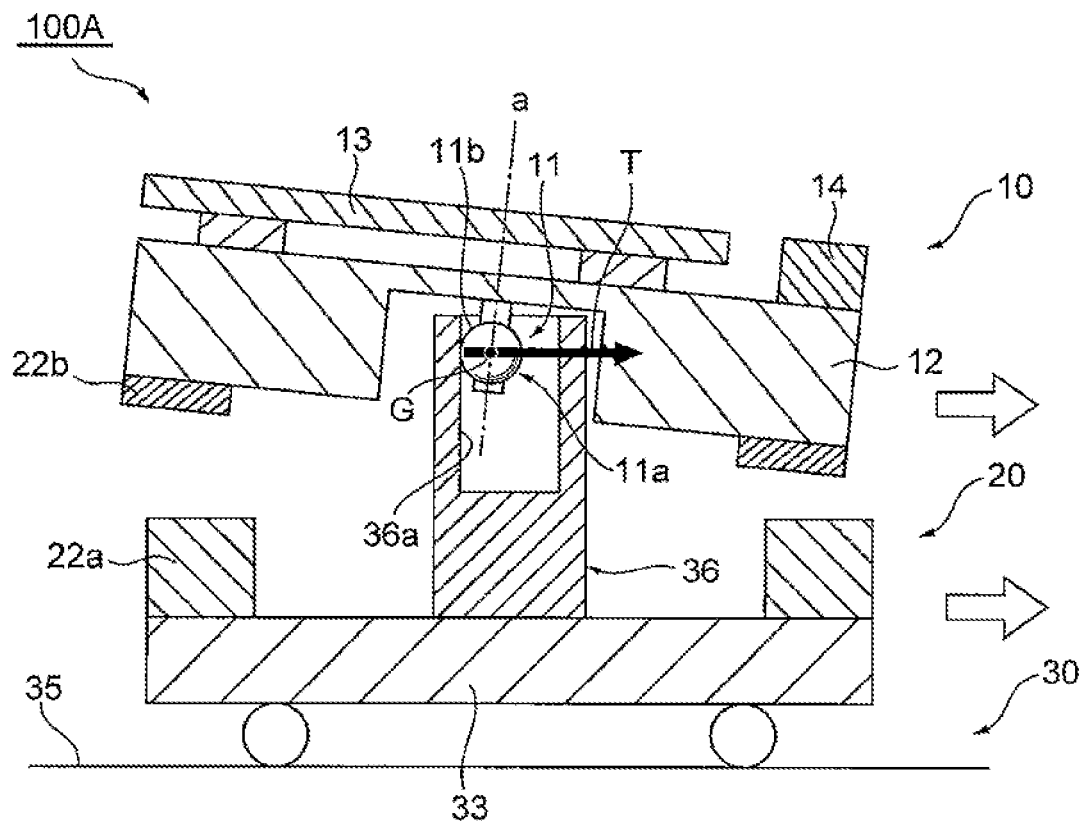
FIG. 6 is a schematic cross-sectional view for describing an operation of the stage device illustrated in FIG. 5.

FIG. 5 is a schematic cross-sectional view of a stage device 100A according to a modification of the stage device 100 illustrated in FIG. 2. FIG. 6 is a schematic cross-sectional view for describing an operation of the stage device 100A illustrated in FIG. 5.

The stage device 100A according to the present modification is different from the stage device 100 according to the above-described embodiment in terms that the propulsion-applying surface 36a is an inner peripheral surface of the cylindrical propulsion-applying unit 36 and the propulsion-receiving surface 11b is an outer surface of a spherical distal portion of the propulsion-receiving unit 11 arranged inside the cylindrical propulsion-applying unit 36. Since the other points of the stage device 100A of the present modification are the same as those of the stage device 100 of the above-described embodiment, the same parts will be denoted by the same reference signs, and the descriptions thereof will be omitted.

In the stage device 100A according to the present modification, the propulsion-receiving unit 11 is provided, for example, in a columnar shape centered on the axis A passing through the center of gravity G of the support stage 10, and protrudes toward the movement stage 30 from a bottom surface of a recess provided on the lower surface of the top table 12. The propulsion-receiving unit 11 has the spherical contact portion 11a at its distal portion. The propulsion-receiving unit 11 is provided such that, for example, the center of the propulsion-receiving surface 11b on a spherical surface of the contact portion 11a coincides with the center of gravity G of the support stage 10 or is located on an axis a of the propulsion-receiving unit 11 passing through the center of gravity G.

According to the stage device 100A of the present modification, it is possible to achieve the same effects as the stage device 100 according to the above-described embodiment. Furthermore, it is possible to suppress the generation of the moments about the X axis and the Y axis on the support stage 10 even when the support stage 10 is tilted with respect to the XY plane as illustrated in FIG. 6.

Figure 7:
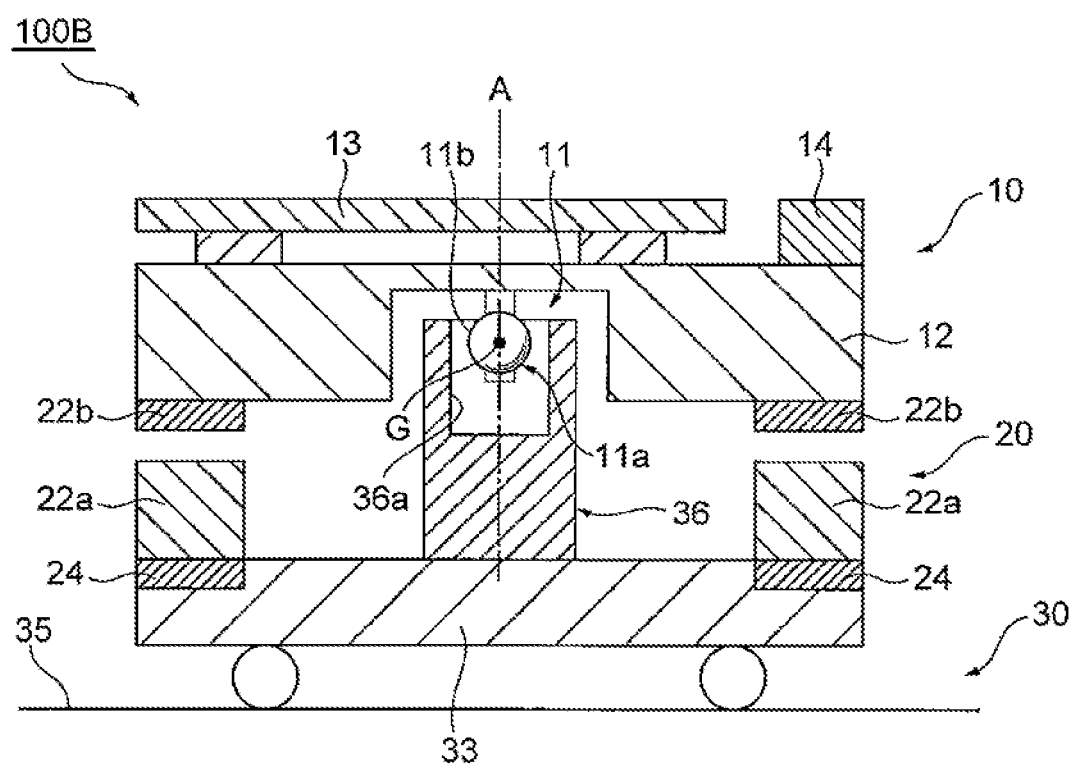
FIG. 7 is a schematic cross-sectional view of a stage device according to a modification of the stage device illustrated in FIG. 5.

FIG. 7 is a schematic cross-sectional view of a stage device 100B according to a modification of the stage device 100A illustrated in FIG. 5. The stage device 100B of the present modification example is different from the stage device 100A illustrated in FIG. 5 in terms that the support stage 10 and the movement stage 30 include permanent magnets that repel each other. Since the other points of the stage device 100B of the present modification are the same as those of the stage device 100A of the above-described modification, the same parts will be denoted by the same reference signs, and the descriptions thereof will be omitted.

As described above, the support stage 10 has the X-magnets 21b, the Y-magnets 22b, and the Z-magnets 23b which are permanent magnets. The movement stage 30 is provided with permanent magnets 24 on the side of the X-coil 21a, the Y-coil 22a, and the Z-coil 23a opposite to the support stage 10, for example. The permanent magnet 24 provided on the movement stage 30 repels each of the X-magnet 21b, the Y-magnet 22b, and the Z-magnet 23b provided on the support stage 10, and functions as a magnet for gravity compensation that compensates for the gravity of the support stage 10.

With this configuration, the weight of the support stage 10 can be supported by the repulsive force between each of the X-magnet 21b, the Y-magnet 22b, and the Z-magnet 23b, and the permanent magnet 24 opposing each magnet, and the Z-coil 23a can be downsized. Therefore, it is possible to suppress the leakage of the magnetic field, suppress the heat generation, improve the responsiveness by reducing the movable mass, and reduce the device size and manufacturing cost.

Figure 8:
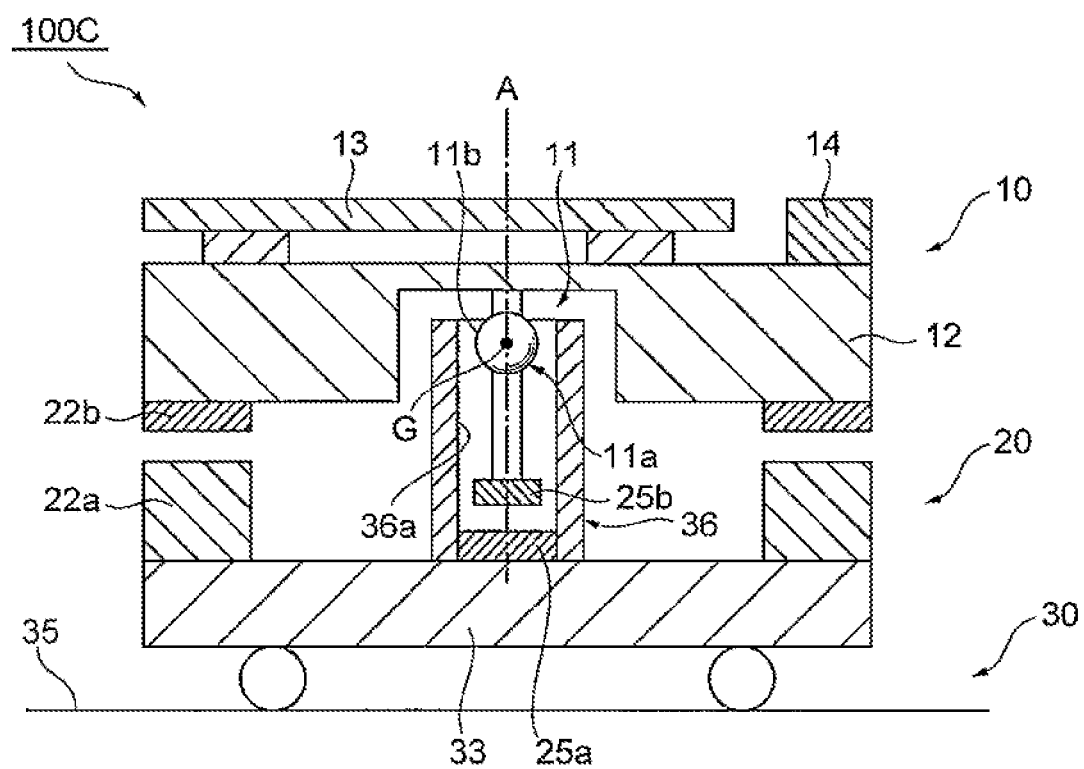
FIG. 8 is a schematic cross-sectional view of a stage device according to a modification of the stage device illustrated in FIG. 5.

FIG. 8 is a schematic cross-sectional view of a stage device 100C according to a modification of the stage device 100A illustrated in FIG. 5. The stage device 100C of the present modification is different from the stage device 100A illustrated in FIG. 5 in terms that the propulsion-applying unit 36 and the propulsion-receiving unit 11 include permanent magnets 25a and 25b that repel each other in the protruding direction of the propulsion-applying unit 36. Since the other points of the stage device 100C of the present modification are the same as those of the stage device 100A of the above-described modification, the same parts will be denoted by the same reference signs, and the descriptions thereof will be omitted.

According to the stage device 100C of the present modification, the weight of the support stage 10 can be supported by a repulsive force between the support stage 10 and each of the permanent magnets 25a and 25b, and the Z-coil 23a can be downsized. Therefore, it is possible to suppress the leakage of the magnetic field, suppress the heat generation, improve the responsiveness by reducing the movable mass, and reduce the device size and manufacturing cost.

Further, in the stage device 100B illustrated in FIG. 7, the repulsive forces in the X-axis direction and the Y-axis direction, which become a disturbance, are generated when the permanent magnets 24 and each of the X-magnet 21b, the Y-magnet 22b, and the Z-magnet 23b, which face each other in the Z-axis direction, deviate in the X-axis direction and the Y-axis direction. Such a disturbance can be also generated due to individual differences in the magnetic flux density of the permanent magnets 24 or errors in the arrangement and shape when the plurality of permanent magnets 24 are arranged.

In the stage device 100C of the present modification illustrated in FIG. 8, however, the propulsion-applying unit and the propulsion-receiving unit 11 include the single permanent magnets 25a and 25b, respectively. As a result, it is possible to eliminate the above-described disturbance and improve the positioning accuracy of the stage device 100C. Note that, from the viewpoint of improving the positioning accuracy of the stage device 100C, it is preferable that the area of the permanent magnet 25a of the propulsion-applying unit 36 opposing the permanent magnet 25b of the propulsion-receiving unit 11 be larger than the area of the permanent magnet 25b of the propulsion-receiving unit 11 opposing the permanent magnet 25a of the propulsion-applying unit 36. As a result, it is possible to more reliably suppress the above-described disturbance.

Figure 9:
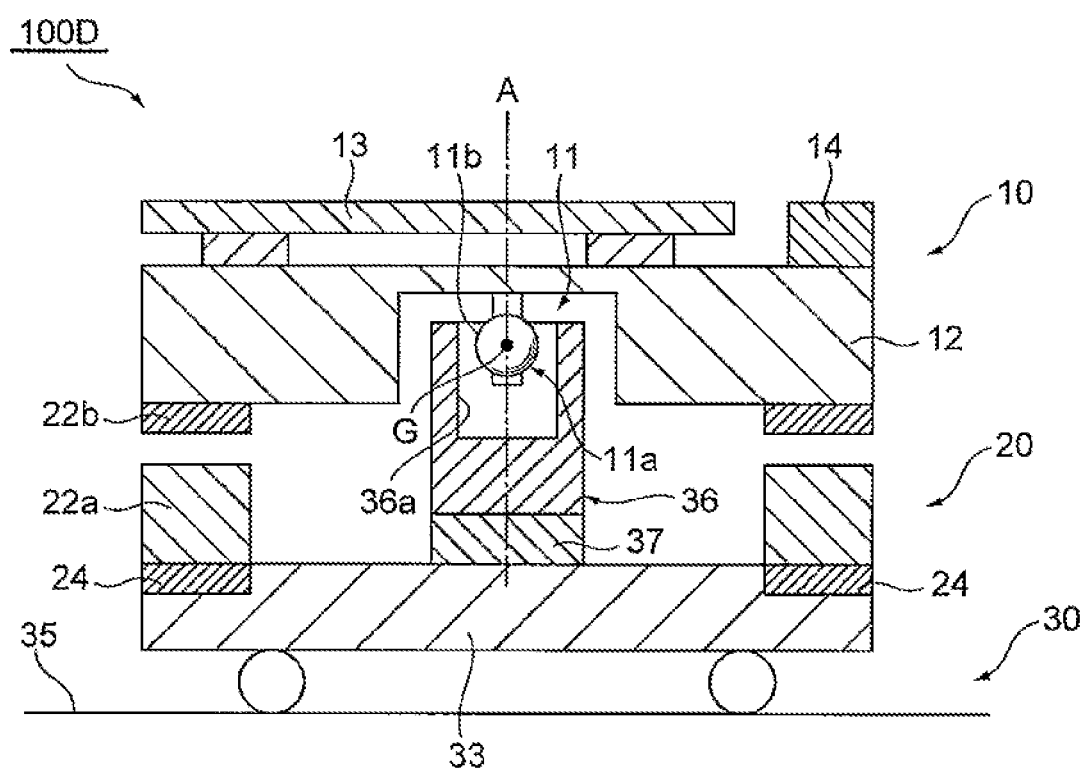
FIG. 9 is a schematic cross-sectional view of a stage device according to a modification of the stage device illustrated in FIG. 7.

FIG. 9 is a schematic cross-sectional view of a stage device 100D according to a modification of the stage device 100B illustrated in FIG. 7. The stage device 100D of the present modification is different from the stage device 100B illustrated in FIG. 7 in terms that the movement stage 30 includes an actuator 37 that moves the propulsion-applying unit 36 in the movement direction of the movement stage 30. Since the other points of the stage device 100D of the present modification are the same as those of the stage device 100B of the above-described modification, the same parts will be denoted by the same reference signs, and the descriptions thereof will be omitted.

The actuator 37 is configured using, for example, a piezo actuator, and moves the propulsion-applying unit 36 in the movement direction of the movement stage 30 to bring the propulsion-applying unit 36 and the propulsion-receiving unit into contact with each other in a short time when the support stage 10 is moved at high speed and high acceleration. As a result, it is possible to improve the responsiveness of the support stage 10 that moves by receiving the propulsion T from the propulsion-applying unit 36.

Figure 10:
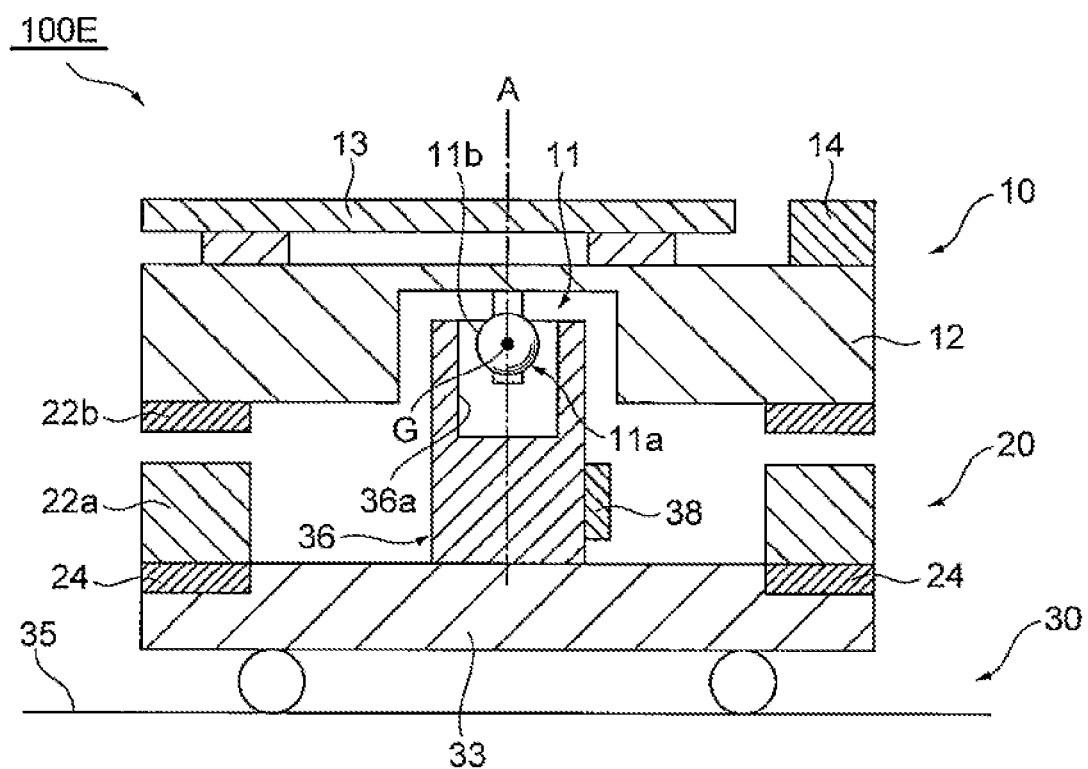
FIG. 10 is a schematic cross-sectional view of a stage device according to a modification of the stage device illustrated in FIG. 7.

FIG. 10 is a schematic cross-sectional view of a stage device 100E according to a modification of the stage device 100B illustrated in FIG. 7. The stage device 100E of the present modification is different from the stage device 100B illustrated in FIG. 7 in terms of including a contact sensor 38 that detects contact between the propulsion-applying unit and the propulsion-receiving unit 11. Since the other points of the stage device 100E of the present modification are the same as those of the stage device 100B of the above-described modification, the same parts will be denoted by the same reference signs, and the descriptions thereof will be omitted.

In the stage device 100E of the present modification, the contact sensor 38 can detect the contact between the propulsion-applying unit 36 and the propulsion-receiving unit 11. Therefore, an impact force applied to the support stage at the time of contact or separation between the propulsion-applying unit 36 and the propulsion-receiving unit can be measured and used for levitation control of the support stage 10 performed by the floating mechanism 20. As a result, it is possible to instantly suppress the support stage 10 after the movement of the support stage 10. Note that the contact between the propulsion-applying unit 36 and the propulsion-receiving unit 11 may be detected by a displacement sensor that measures relative displacement between the X-table 33 and the support stage 10.

Figure 11:
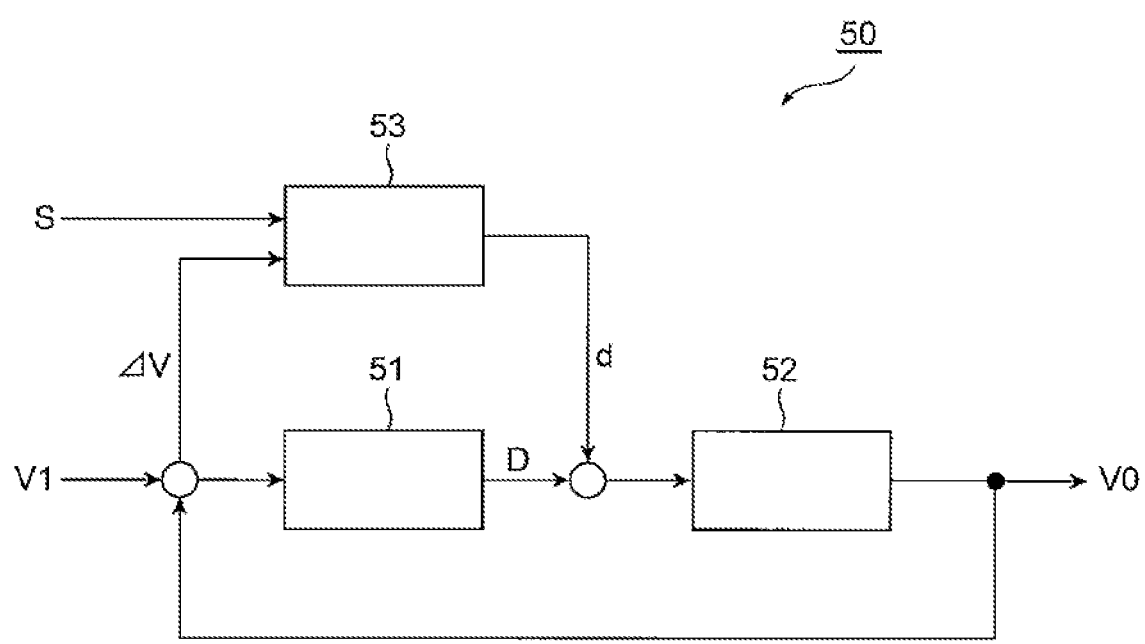
FIG. 11 is a block diagram illustrating an example of a control unit of the stage device illustrated in FIG. 10.

FIG. 11 is a block diagram illustrating an example of a control unit 50 of the stage device 100E illustrated in FIG. 10. The stage device 100E includes the control unit 50 that controls the floating mechanism 20 based on an output signal of the contact sensor 38. The control unit 50 includes, for example, a servo controller 51, a control target 52, and a learning controller 53. The servo controller 51 receives inputs of a command value V1 and a current value V0 of the position and posture of the support stage 10 and controls the control target 52. The control target 52 includes the movement stage 30, the floating mechanism 20, and the support stage 10.

The control unit 50 uses an output signal S from the contact sensor 38 for a feedback loop formed by the servo controller 51 and the control target 52. The control unit 50 inputs a deviation ΔV between the command value V1 and the current value V0 and the output signal S of the contact sensor to the learning controller 53, and automatically adjusts the learning controller 53. The learning controller 53 outputs a correction value d to correct an output value D of the servo controller 51 so as to reduce the deviation ΔV. The learning controller 53 can include an adaptive filter.

With this configuration, it is possible to constantly minimize the influence of resonance between the propulsion-applying unit 36 and the propulsion-receiving unit 11 regardless of a device difference and a period of use. In order to adjust parameters of the learning controller 53, an operation is performed with various driving patterns before the device is shipped or during maintenance, and the relationship between the deviation ΔV and the correction value d of the propulsion at that time is used as teacher data. As a result, it is possible to reduce an adjustment time and cost of a stage control system before the shipment of the device or during maintenance.

Therefore, according to the stage device 100E of the present modification, it is possible to suppress the vibration caused by collision between the propulsion-applying unit 36 and the propulsion-receiving unit 11 during the movement of the support stage 10 and to constantly obtain optimum drive characteristics. Further, the behavior of the above-described vibration changes to some extent due to individual differences of the device and aging, but the optimum drive characteristics can be constantly obtained by automatically adjusting the control system using learning control.

Figure 12:
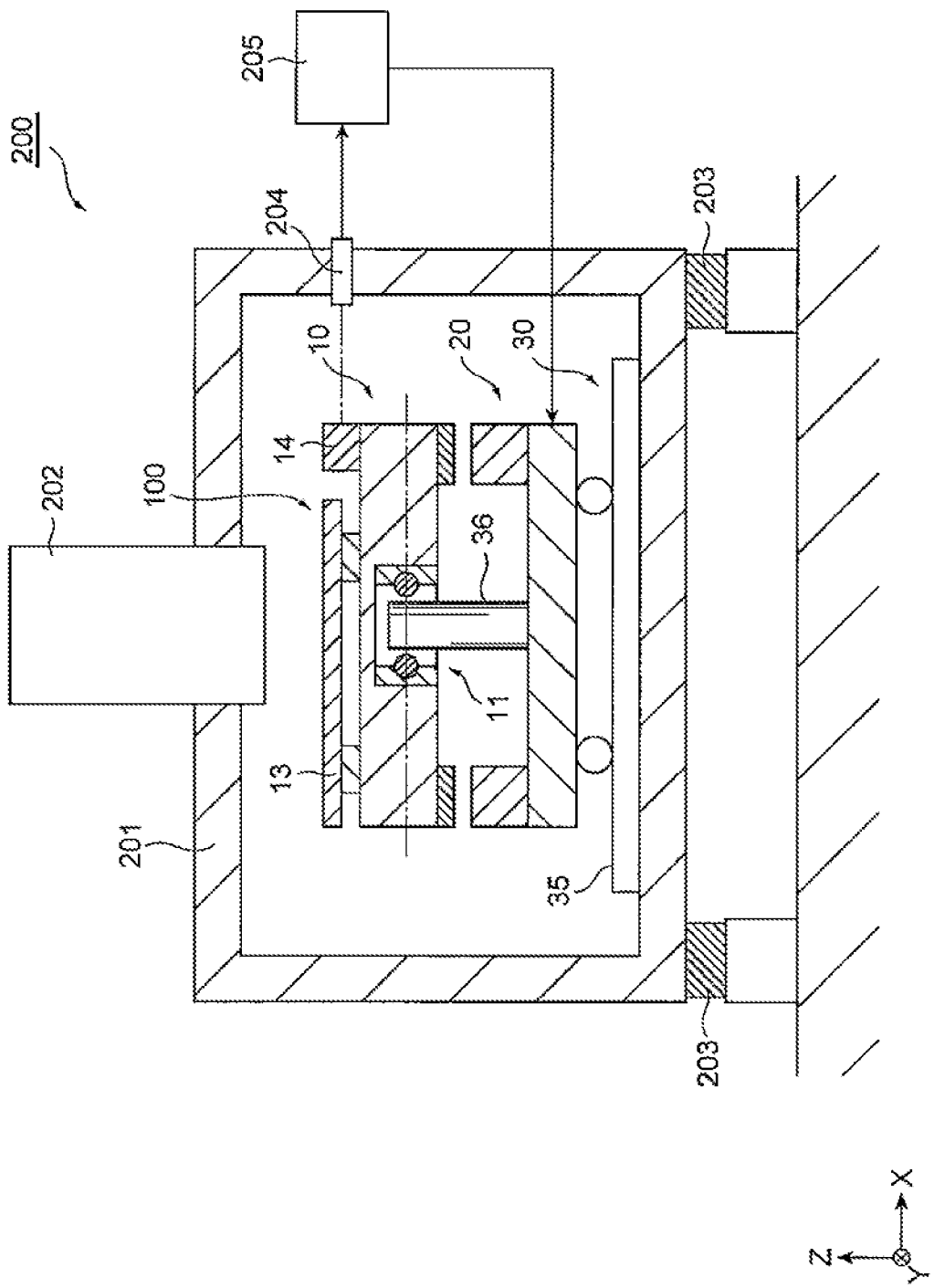
FIG. 12 is a schematic cross-sectional view of a semiconductor measurement device including the stage device illustrated in FIG. 2.

Finally, an embodiment of the charged particle beam apparatus and the vacuum apparatus according to the present disclosure will be described with reference to FIG. 12. FIG. is a schematic cross-sectional view of a semiconductor measurement device 200 including the stage device 100 illustrated in FIG. 2.

The semiconductor measurement device 200, which is the embodiment of the charged particle beam apparatus and the vacuum apparatus according to the present disclosure, includes the stage device 100 that positions an object and a vacuum chamber 201 that houses the stage device 100. The semiconductor measurement device 200 of the present embodiment is, for example, a length measuring SEM as an application device of a scanning electron microscope (SEM).

The semiconductor measurement device 200 includes, for example, the stage device 100, the vacuum chamber 201, an electron optical system lens barrel 202, a vibration damping mount 203, a laser interferometer 204, and a controller 205. The vacuum chamber 201 houses the stage device 100 and is internally depressurized by a vacuum pump (not illustrated) to be in a vacuum state at a pressure lower than atmospheric pressure. The vacuum chamber 201 is supported by a vibration damping mount 203.

The semiconductor measurement device 200 positions an object, such as a semiconductor wafer, using the stage device 100, irradiates the object with an electron beam from the electron optical system lens barrel 202 to image a pattern on the object, and performs measurement of a line width of the pattern and evaluation of shape accuracy. In the stage device 100, a position of the bar mirror 14 is measured by the laser interferometer 204, and the positioning of the object, such as a semiconductor wafer, held on the sample table 13 of the support stage 10 is controlled by the controller 205.

Since the semiconductor measurement device 200 according to the present embodiment includes the stage device 100, it is possible to increase the speed and acceleration of positioning of the object, such as a wafer, and to suppress the leakage of a magnetic field. Therefore, it is possible to improve the measurement accuracy of the semiconductor measurement device 200 as the charged particle beam apparatus. Further, the floating mechanism 20 is a magnetic levitation type in the stage device 100, and thus, can be easily apply to the semiconductor measurement device 200 which is the vacuum apparatus, and it is possible to exhibit excellent effects such as suppression of heat generation. The charged particle beam apparatus and the vacuum apparatus of the present disclosure are not limited to the semiconductor measurement device.

Although the embodiment of the present invention has been described in detail with reference to the drawings as above, a specific configuration is not limited to the embodiment, and design alterations or the like made in a scope not departing from a gist of the present invention is included in the present invention.

REFERENCE SIGNS LIST 10 support stage
11 propulsion-receiving unit
11b propulsion-receiving surface
20 floating mechanism
21b X-magnet (permanent magnet)

22b Y-magnet (permanent magnet)
23b Z-magnet (permanent magnet)
24 permanent magnet
25a permanent magnet
25b permanent magnet
30 movement stage
36 propulsion-applying unit
36a propulsion-applying surface
37 actuator
38 contact sensor
50 control unit
51 servo controller
53 learning controller
100 stage device
100A stage device
100B stage device
100C stage device
100D stage device
100E stage device
200 semiconductor measurement device (charged particle beam apparatus, vacuum apparatus)
201 vacuum chamber
A axis
D output value
d correction value
S output signal
T propulsion
V0 current value
V1 command value
ΔV deviation

The invention claimed is:

1. A stage device comprising:
a support stage that supports an object to be positioned;
a floating mechanism that magnetically levitates and positions the support stage; and
a movement stage that supports the floating mechanism on a flat surface and moves the floating mechanism in a movement direction along the flat surface,
wherein the movement stage has a projection that protrudes toward the support stage,
the support stage has a recess that opposes the projection with a gap in the movement direction, and
when the movement stage moves in the movement direction and the projection contacts or approaches the recess, the projection applies propulsion in the movement direction to the recess,
wherein the projection applies the propulsion to the recess when the projection contacts the recess.

2. The stage device according to claim 1, wherein
the projection has a propulsion-applying surface having a cylindrical shape centered on an axis that is orthogonal to the movement direction and extends along a protruding direction of the projection,
the recess has a propulsion-receiving surface having a circular arc shape in which a contour shape of a cross section taken along the axis of at least a portion opposing the propulsion-applying surface protrudes toward the propulsion-applying surface, and
the propulsion-applying surface contacts the propulsion-receiving surface when the projection contacts the recess.

3. The stage device according to claim 2, wherein
the propulsion-applying surface is a columnar or cylindrical outer peripheral surface of the projection, and
the propulsion-receiving surface is an inner peripheral surface of the annular recess surrounding the projection.

4. The stage device according to claim 3, wherein the projection and the recess include permanent magnets that repel each other in the protruding direction of the projection.

5. The stage device according to claim 3, wherein the movement stage includes an actuator that moves the projection in the movement direction.

6. The stage device according to claim 2, wherein
the propulsion-applying surface is an inner peripheral surface of the cylindrical projection, and
the propulsion-receiving surface is an outer surface of a spherical distal portion of the recess arranged inside the cylindrical projection.

7. The stage device according to claim 1, further comprising a contact sensor that detects contact between the projection and the recess.

8. The stage device according to claim 7, further comprising a control unit that controls the floating mechanism based on an output signal of the contact sensor.

9. The stage device according to claim 8, wherein
the control unit includes:
a servo controller to which a command value and a current value of a position and a posture of the support stage are input; and
a learning controller to which a deviation between the command value and the current value and the output signal of the contact sensor are input, and
the learning controller outputs a correction value to correct an output value of the servo controller so as to reduce the deviation.

10. The stage device according to claim 1, wherein
the projection and the recess include permanent magnets that repel each other, and
when the projection approaches the recess, the projection applies the propulsion to the recess by a repulsive force between the permanent magnets.

11. A charged particle beam apparatus comprising a stage device for positioning an object, wherein
the stage device includes: a support stage that supports an object to be positioned; a floating mechanism that magnetically levitates and positions the support stage; and a movement stage that supports the floating mechanism on a flat surface and moves the floating mechanism in a movement direction along the flat surface,
the movement stage has a projection that protrudes toward the support stage,
the support stage has a recess that opposes the projection with a gap in the movement direction, and
when the movement stage moves in the movement direction and the projection contacts or approaches the recess, the projection applies propulsion in the movement direction to the recess,
wherein the projection applies the propulsion to the recess when the projection contacts the recess.

12. A vacuum apparatus comprising:
a stage device for positioning an object; and
a vacuum chamber accommodating the stage device,
wherein the stage device includes: a support stage that supports an object to be positioned; a floating mechanism that magnetically levitates and positions the support stage; and a movement stage that supports the floating mechanism on a flat surface and moves the floating mechanism in a movement direction along the flat surface,
the movement stage has a projection that protrudes toward the support stage,
the support stage has a recess that opposes the projection with a gap in the movement direction, and when the movement stage moves in the movement direction and the projection contacts or approaches the recess, the projection applies propulsion in the movement direction to the recess, wherein the projection applies the propulsion to the recess when the projection contacts the recess.

\* \* \* \* \*